(12) United States Patent
Barbe et al.

(10) Patent No.: US 8,236,698 B2
(45) Date of Patent: Aug. 7, 2012

(54) METHOD FOR FORMING NON-ALIGNED MICROCAVITIES OF DIFFERENT DEPTHS

(75) Inventors: Jean-Charles Barbe, Grenoble (FR); Erwan Dornel, Vern sur Seiche (FR); François De Crecy, Seyssins (FR); Joël Eymery, Sassenage (FR)

(73) Assignee: Commissariat a l'Energie Atomique, Paris (FR)

( * ) Notice: Subject to any disclaimer, the term of this patent is extended or adjusted under 35 U.S.C. 154(b) by 55 days.

(21) Appl. No.: 12/519,356

(22) PCT Filed: Dec. 20, 2007

(86) PCT No.: PCT/EP2007/064324
§ 371 (c)(1),
(2), (4) Date: Apr. 26, 2010

(87) PCT Pub. No.: WO2008/074861
PCT Pub. Date: Jun. 26, 2008

(65) Prior Publication Data
US 2010/0230674 A1 Sep. 16, 2010

(30) Foreign Application Priority Data
Dec. 21, 2006 (FR) ..................................... 06 55817

(51) Int. Cl.
*H01L 21/311* (2006.01)
(52) U.S. Cl. .. 438/700; 438/701; 438/713; 257/E21.218
(58) Field of Classification Search .................. 438/700, 438/701, 713, E21.218
See application file for complete search history.

(56) References Cited

U.S. PATENT DOCUMENTS

| | | | |
|---|---|---|---|
| 5,965,914 A | 10/1999 | Miyamoto | |
| 6,100,132 A * | 8/2000 | Sato et al. | 438/243 |
| 6,383,924 B1 | 5/2002 | Farrar et al. | |
| 7,078,296 B2 * | 7/2006 | Chau et al. | 438/270 |
| 2005/0275010 A1 | 12/2005 | Chen et al. | |
| 2006/0019459 A1 | 1/2006 | Vinet et al. | |

(Continued)

FOREIGN PATENT DOCUMENTS

EP 1427010 A1 6/2004

OTHER PUBLICATIONS

Wolf and Tauber, Silicon Processing for the VLSI Era, vol. 1, Lattice Press, 2000; pp. 656, 666, 667.*

(Continued)

*Primary Examiner* — Julia Slutsker
(74) *Attorney, Agent, or Firm* — Nixon Peabody LLP

(57) ABSTRACT

The invention relates to a method for forming microcavities (118) of different depths in a layer (102) based on at least an amorphous or monocrystalline material, comprising at least the following steps in which: at least one shaft and/or trench is formed in the layer (102) so as to extend through one face (101) thereof, such that two sections of the shaft and/or the trench, in two different planes parallel to the face (101), are aligned in relation to one another along an alignment axis forming a non-zero angle with a normal to the plane of said face (101); and the layer (102) is annealed in a hydrogenated atmosphere so as to transform the shaft and/or trench into at least two microcavities (118).

8 Claims, 9 Drawing Sheets

U.S. PATENT DOCUMENTS

2006/0049429 A1     3/2006    Kim et al.
2007/0105321 A1     5/2007    Lee et al.
2009/0124050 A1     5/2009    Dornel et al.

OTHER PUBLICATIONS

International Search Report for PCT/EP2007/064324 dated Apr. 18, 2008.

French Preliminary Search Report for French Application No. 0655817 dated Sep. 5, 2007.

Tsutomu Sato, et al., "Micro-Structure Transformation of Silicon: A Newly Developed Transformation Technology for Patterning Silicon Surfaces Using the Surface Migration of Silicon Atoms by Hydrogen Annealing", Japanese Journal of Applied Physics, Sep. 2000, pp. 5033-5038, vol. 39, No. 9A, Part 1, Japan Society of Applied Physics, Tokyo, JP.

Tsutomu Sato, et al., "Fabrication of Silicon-on-Nothing Structure by Substrate Engineering Using the Empty-Space-in-Silicon Formation Technique", Japanese Journal of Applied Physics, 2004, pp. 12-18, vol. 43, No. 1.

J.M. Hartmann, et al., "Growth Kinetics of Si and SiGe on Si(100), Si(110) and Si(111) Surfaces", Journal of Crystal Growth 294, 2006, pp. 288-295.

D.C. Houghton, "Strain Relaxation Kinetics in $Si_{1-x}Ge_x/Si$ Heterostructures", Journal of Applied Physics, Aug. 15, 1991, pp. 2136-2151, vol. 70, Issue 3.

R. People, et al., "Calculation of Critical Layer Thickness Versus Lattice Mismatch for $Ge_xSi_{1-x}/Si$ Strained-Layer Heterostructures", Applied Physics Letters, Aug. 1, 1985, pp. 322-324, vol. 47, Issue 3.

Mitsuhiro Shikida, et al., "Differences in Anisotropic Etching Properties of KOH and TMAH Solutions", Sensors and Actuators A: Physical, Mar. 2000, pp. 179-188, vol. 80.

O. Spulber, et al., "1.7kV NPT V-Groove Clustered IGBT—Fabrication and Experimental Demonstration", ISPSD, Apr. 14-17, 2003, pp. 345-348, Cambridge, UK.

Ming-Chang M. Lee, et al., "Thermal Annealing in Hydrogen for 3-D Profile Transformation on Silicon-on-Insulator and Sidewall Roughness Reduction", Journal of Microelectromechanical Systems, Apr. 2006, pp. 338-343, vol. 15, No. 2.

Ming-Chang M. Lee et al., "Silicon Profile Transformation and Sidewall Roughness Reduction Using Hydrogen Annealing", Micro Electro Mechanical Systems, MEMS, 18th IEEE International Conference, Jan. 30-Feb. 3, 2005, pp. 569-599.

Th Stelzner et al., "Growth of Silicon Nanowires by Chemical Vapour Deposition on Gold Implanted Silicon Substrates", Nanotechnology, Jun. 28, 2006, pp. 2895-2898, vol. 17, No. 12, Institute of Physics Publishing.

\* cited by examiner

METHOD FOR FORMING NON-ALIGNED MICROCAVITIES OF DIFFERENT DEPTHS

CROSS REFERENCE TO RELATED APPLICATIONS OR PRIORITY CLAIM

This application is a national phase of International Application No. PCT/EP2007/064324, entitled "METHOD FOR FORMING NON-ALIGNED MICROCAVITIES OF DIFFERENT DEPTHS", which was filed on Dec. 20, 2007, and which claims priority of French Patent Application No. 06 55817, filed Dec. 21, 2006.

TECHNICAL FIELD AND PRIOR ART

The invention relates to a method for forming non-aligned microcavities and/or micro-channels arranged at different depths within a material such as silicon.

In the remainder of this document, the term "microcavity" will be understood as designating a microcavity or a micro-channel.

Microcavities, the dimensions of which may for example be between several nanometers and several hundreds of micrometers, are used in numerous application fields:

- "Lab-On-Chip", performing chemical, biological, proteomic, or DNA analyses, or DNA amplifications by PCR (Polymerase Chain Reaction), or instead for the handling, sorting or analysis of biological cells or components of these biological cells: in such a device, a network of microcavities may, for example, be used to analyse one or several samples by different reactants without mixing the samples and/or reactants,
- micro electromechanical systems (MEMS) and nano electromechanical systems (NEMS): by forming microcavities in a substrate intended to support a micro or nano mechanical structure, it is possible to manufacture such a structure without a subsequent step of release of the structure in relation to the remainder of the substrate,
- high frequency (HF) electronics: the microcavities make it possible to electromagnetically decouple the HF part of the electronic device from the substrate and/or neighbouring devices,
- devices for thermally controlling electronic chips: a network of microcavities formed in a substrate may be used to reduce the apparent thermal conductivity of the material of the substrate on which the chips are formed: a network of buried microcavities may also be used to control the temperature of components formed on the surface of the substrate by circulating a heat transfer fluid therein, for example to cool these components; a network of microcavities filled with an electrically conductive material can also be used to control the temperature of electronic components by circulating therein an electrical current to adjust the temperature by Joule effect, the dissipated thermal power then being proportional to the current circulating in the conductive material,
- electronic devices formed on a SON (Silicon On Nothing) type substrate,
- micro-fluidic and nano-fluidic applications,
- "nanoimprint" type lithographic methods, in which the definition of zones of dedicated shapes may be used to create microcavities opening up into the surface of a substrate to then be used as a mould for forming a mask dedicated to the technique known as "nanoimprint".

Several techniques exist to form microcavities. The document "Micro-structure Transformation of Silicon: A Newly Developed Transformation Technology for Patterning Silicon Surfaces using the Surface Migration of Silicon Atoms by Hydrogen Annealing" of T. Sato et al., Japanese Journal of Applied Physics, Vol. 39, 2000, pages 5033 to 5038, describes for example such a technique. Shafts, in other words holes, for example of substantially circular section, or quite deep trenches (for example several micrometers) in a semi-conductor substrate are formed by etching, such as RIE (Reactive Ion Etching), then the substrate is annealed under hydrogen, at a pressure between around 266 Pa and 100000 Pa and a temperature between 750° C. and 1150° C. During this annealing, a phenomenon of surface diffusion of atoms takes place, leading to the formation of microcavities of substantially spherical shape when the etching made is a shaft, in the shape of hollow cylindrical tubes forming a micro-channel when the etching formed is a rectangular trench or a series of shafts aligned and close together, or instead planar microcavities when the etching forms a plurality of shafts spread out in a sufficiently dense manner at a surface. This technique is known as MSTS (MicroStructure Transformation of Silicon).

One of the advantages of this method is that the microcavities thereby obtained have smooth walls and that the crystalline quality of the material of the substrate surrounding the microcavity is conserved. When the substrate used is based on monocrystalline silicon, the silicon reconstructed around the microcavity during the annealing is also monocrystalline.

The document "Fabrication of Silicon-on-Nothing Structure by Substrate Engineering Using the Empty-Space-in-Silicon Formation Technique" of T. Sato et al., Japanese Journal of Applied Physics, Vol. 43, No. 1, 2004, pages 12 to 18, describes the purely empirical design rules to dimension the size and the position of microcavities obtained by MSTS as a function of the geometry of the trenches or the shafts formed beforehand. For example, by playing on the geometric parameters of the trenches or shafts that structure the surface of the substrate used, it is possible to obtain several of these same structures (spherical, tubular or planar microcavities) vertically aligned.

When it is wished to form, by the previously described technique, structures with several microcavities at different depths, these microcavities are necessarily aligned vertically one above the other. This is a major drawback in a certain number of cases, for example when it is wished to access independently each of these cavities to circulate a fluid therein or to fill them with a different material at each level.

DESCRIPTION OF THE INVENTION

An aim of the present invention is to propose a method that makes it possible to form microcavities over several depth levels in a substrate and which are not aligned one above the other.

To do this, the present invention proposes a method for forming microcavities of different depths in a layer based on at least an amorphous or monocrystalline material, comprising at least the following steps in which:

- forming at least one shaft and/or trench, in the layer, extending through one face of the layer, such that two sections of shaft and/or trench, in two different planes parallel to said face of the layer, are aligned in relation to one another along an alignment axis forming a non-zero angle with a normal to the plane of said face of the layer,
- annealing of the layer under hydrogenated atmosphere so as to transform the shaft and/or the trench into at least two microcavities.

In this way is obtained, from a shaft or a trench inclined in relation to the normal to the plane of the face of the layer, an opening of the shaft and/or the trench being located at this face, microcavities arranged at different depths in the layer and aligned in relation to one another along the axis forming a non-zero angle in relation to a normal to said plane of the layer.

The formation of the shaft and/or the trench may be implemented by the steps of:
- forming a hole, in the layer, comprising at least side walls inclined along a non-zero angle in relation to the normal to the plane of said face of the layer,
- deposition or epitaxy of a second layer, based on at least one second material being able to be selectively etched in relation to the amorphous or monocrystalline material, on at least one side wall of the hole,
- deposition or epitaxy of a third layer, based on at least one third material, the second material being able to be selectively etched in relation to this third material, at least on the second layer,
- eliminating at least a part of the second layer, the released space forming the shaft and/or the trench.

The present invention also relates to a device comprising at least one monocrystalline or amorphous layer, in which is formed at least two microcavities of different depths obtained by the implementation of a method for forming microcavities over several depth levels, object of the present invention.

BRIEF DESCRIPTION OF DRAWINGS

The present invention will be better understood on reading the description of embodiments, given purely by way of indication and in no way limiting, and by referring to the appended figures in which.

Identical, similar or equivalent parts of the different figures described hereafter bear the same number references so as to make it easier to go from one figure to the next.

In order to make the figures easier to read, the different parts represented in the figures are not necessarily to the same scale.

The different possibilities (alternatives and embodiments) should be understood as not been mutually exclusive and may be combined together.

DETAILED DESCRIPTION OF SPECIFIC EMBODIMENTS

A method for forming non-aligned microcavities of different depths, according to a first embodiment, will now be described with reference to FIGS. 1 to 10.

Figure 1:
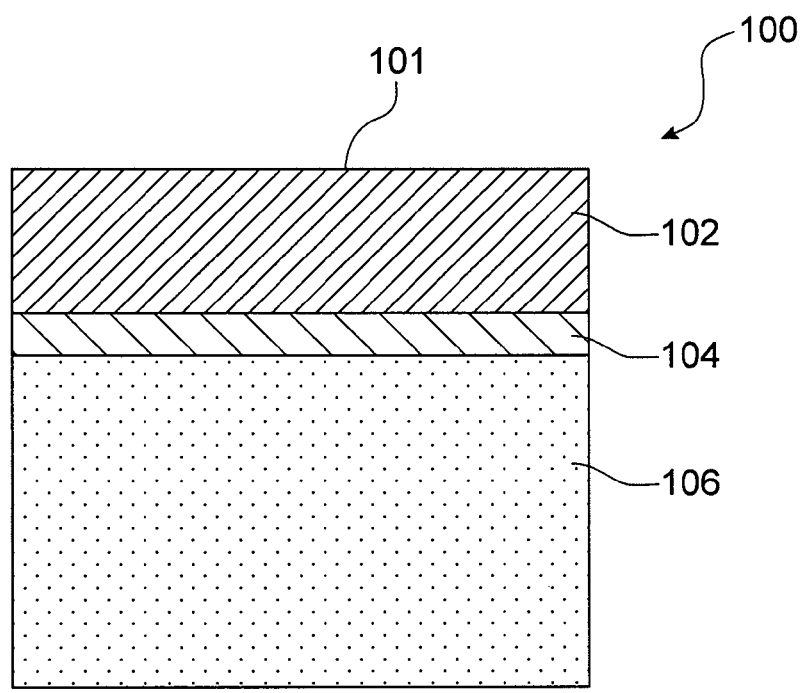
FIGS. 1 to 10 show the steps of a method for forming microcavities of different depths, object of the present invention, according to a first embodiment.

A device 100, represented in FIG. 1, comprises a layer 102, for example flat or substantially flat, based on an amorphous or monocrystalline material, such as silicon. In this embodiment, the device 100 is an SOI (Silicon On Insulator) type substrate comprising the monocrystalline or amorphous layer 102, at least one insulating layer 104 on which is arranged the layer 102, the insulating layer 104 being itself arranged on a substrate 106 for example based on silicon, and/or quartz and/or any other material compatible with common techniques of forming an SOI type substrate. The insulating layer 104 may be formed by a stack of one or several insulating materials, for example silicon dioxide, silicon nitride or diamond carbon.

In the case where the monocrystalline or amorphous layer 102 and the substrate 106 are based on silicon, the insulating layer 104 may for example comprise a stack of three sub-layers, respectively based on silicon dioxide, silicon nitride and silicon dioxide, the sub-layers of silicon dioxide being in contact with the layer 102 and the substrate 106 to assure an optimised bonding of the layer 102 on the insulating layer 104 and of the insulating layer 104 on the substrate 106.

The monocrystalline or amorphous layer 102 may for example have a thickness between around 10 nm and 20 µm, this thickness may be adjusted by etching if the original thickness of the layer 102 is too low, or by epitaxy (then enabling the crystalline nature of the layer 102 to be conserved) or deposition when the original thickness of the layer 102 is too low. The insulating layer 104 may have a thickness equal to around 145 nm but its thickness may itself be adjusted while forming the device 100. When the insulating layer 104 comprises a stack, said stack may be formed by a first sub-layer based on silicon dioxide and of thickness equal to around 5 nm, a second sub-layer based on silicon nitride and of thickness equal to around 70 nm, and a third sub-layer based on silicon dioxide and of thickness equal to around 70 nm. Finally, the substrate 106 may have a thickness between around 500 µm and 800 µm. Preferably, the thickness of the substrate 106 is proportional to the width of the substrate 106 in order to assure a sufficient mechanical stiffness to avoid breaking the substrate 106 during the method described.

The material of the layer 102 may also be based on silicon, and/or germanium, and/or silicon-germanium, and/or gallium arsenide, and/or indium phosphide, and/or indium arsenide, and/or gallium and aluminium arsenide, and/or gallium and indium arsenide, and/or quartz, and/or any other monocrystalline material. This material may also be an amorphous material, for example silicon dioxide and/or silicon nitride.

Figure 2:
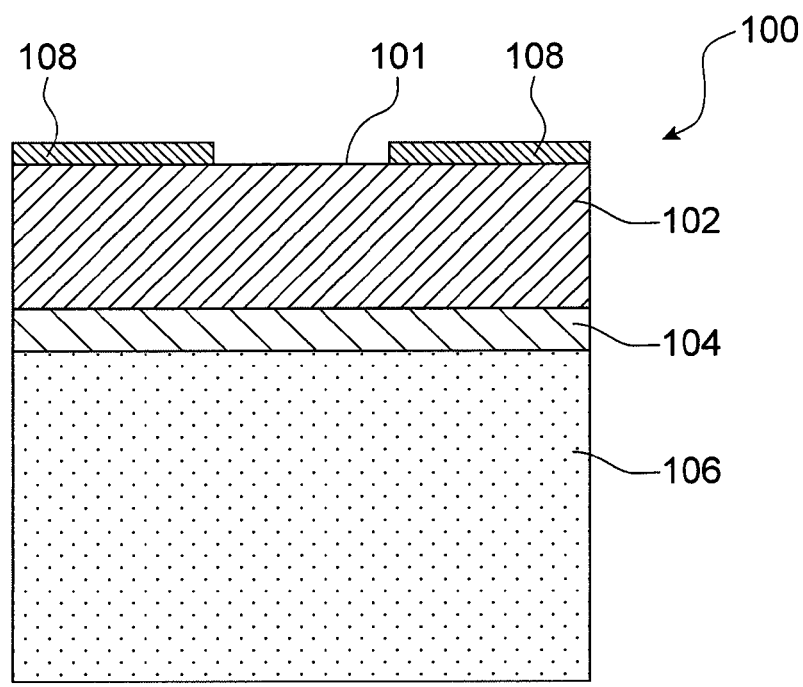

As represented in FIG. 2, an etch mask 108 for example based on silicon dioxide, and/or a stack of silicon dioxide and silicon nitride, and/or even a stack of amorphous carbon and silicon dioxide is formed for example by photolithoetching on a principal upper face 101 of the layer 102. The pattern of the etch mask 108 represents the section, at the face 101, of a hole that is going to be formed in the layer 102.

An anisotropic etching of the layer 102 according to the pattern formed by the mask 108 is then carried out. In this embodiment, the layer 102 being based on silicon, this anisotropic etching is for example an etching carried out from a potassium hydroxide solution (KOH) or TMAH (Tetra Methyl Ammonium Hydroxide). In this first embodiment, the upper face 101 of the layer 102 having a crystalline orientation of type (001) or (011), this etching makes it possible to reveal dense planes (111), as described in the document "Differences in anisotropic etching properties of KOH and TMAH solutions" of M. Shikida et al., Sens. actuators, A Phys., 2000, n° 80, pages 179 to 188. In addition, the details of an implementation of this type of etching is disclosed in the document "1.7 kV NPT V-Groove Clustered IGBT—Fabrication and Experimental Demonstration" of O. Spulber et al., ISPSD 2003, 14-17 April, Cambridge.

Figure 3A:
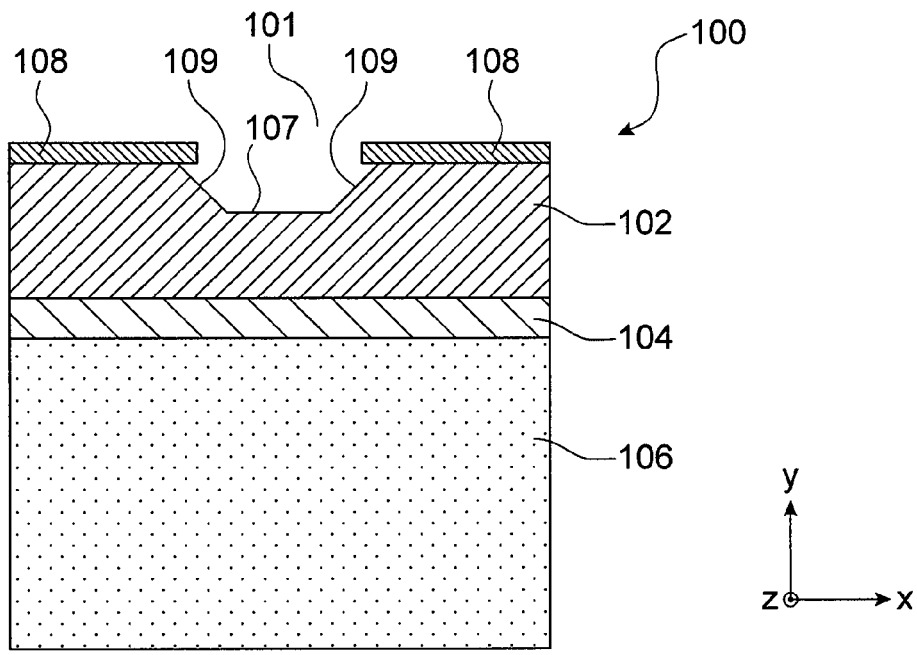
Figure 3B:
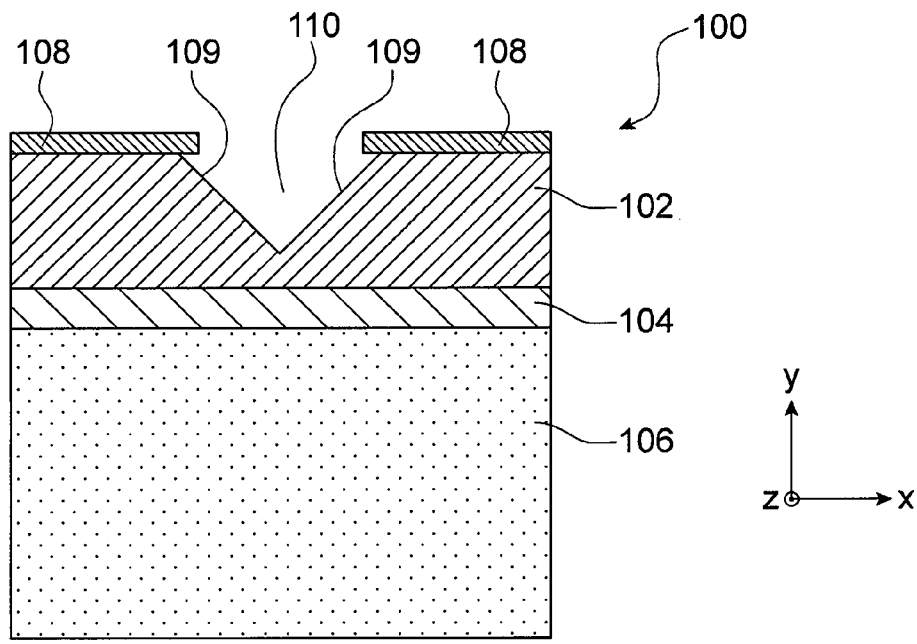

In this way is obtained, in the layer 102, a hole 110 which, in section in a plane perpendicular to the face 101, for example the plane (x,y) (along the axes x, y and z represented in FIGS. 3A and 3B), has a trapezoidal shape as represented in FIG. 3A, the hole 110 then comprising side walls 109 and a bottom horizontal wall 107 parallel to the face 101, or triangular as represented in FIG. 3B, the hole 110 only comprising side walls 109. The triangular shape of the hole 110 represented in FIG. 3B is obtained with a longer etching time than that enabling a trapezoidal hole 110 of FIG. 3A to be obtained, without having to modify the other parameters of the etching.

The section of the hole 110 in a plane parallel to the plane (z,x) (along the axes x, y and z represented in FIGS. 3A and 3B), in other words in a plane parallel to the face 101 of the layer 102, may be of rectangular, square, circular shape, or instead any other shape. The dimensions of the sides of this section of the hole 110 may be substantially similar to each other, the hole 110 then forming a shaft. The dimensions of this section of the hole 110 may also be substantially different, for example greater along the z axis than along the x axis, the hole 110 then forming a trench in the layer 102, the largest dimension of which is for example the dimension along the z axis, for example between around 50 nm and several microns.

The remainder of the description is based on the hole 110 as represented in FIG. 3A.

Figure 4:
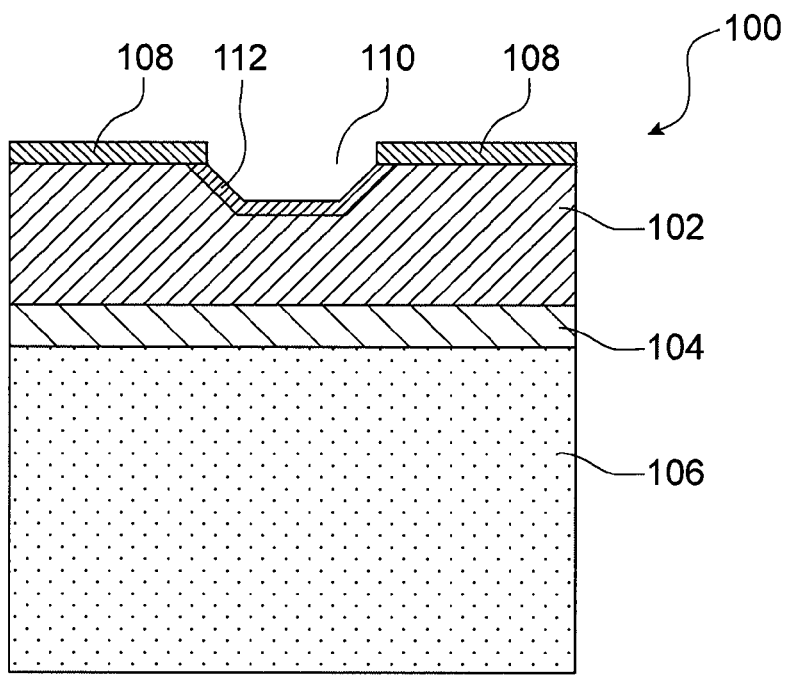

As represented in FIG. 4, a deposition, or an epitaxy, is carried out of a layer 112 based on a material that can be etched selectively in relation to the amorphous or monocrystalline material of the layer 102, on the walls 107 and 109 of the hole 110. The formation of the layer 112 by epitaxy on the layer 102 makes it possible to transmit the crystalline structure of the material of the layer 102 to the material of the layer 112. The material of the layer 112 may for example be an alloy based on silicon-germanium when the material of the layer 102 is silicon, as is the case in this embodiment. In an alternative, if the material of the layer 102 is based on gallium arsenide, the material of the layer 112 may be based on aluminium arsenide, and/or an alloy based on aluminium and/or gallium and/or arsenic.

It is also possible to choose a pair of materials of the layers 102 and 112 such that it is possible to carry out a heteroepitaxy between these two materials, in other words that it is possible to carry out an epitaxy of the material of the layer 112 on that of the layer 102 and vice versa, that it is possible to carry out an epitaxy of the material of the layer 102 on that of the layer 112, such as for example silicon and silicon-germanium.

Figure 5:
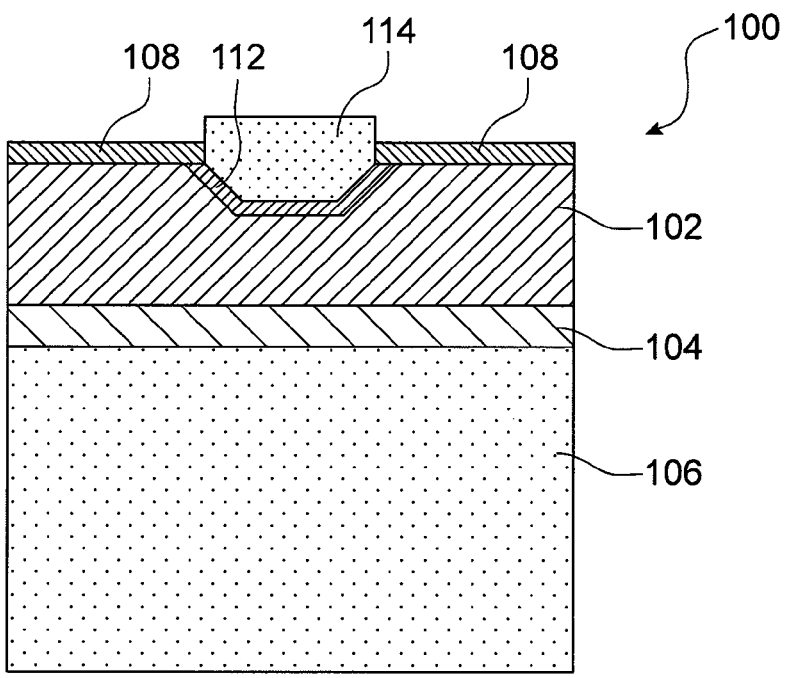

Then, a deposition or an epitaxy is carried out of a layer 114 based on a material that can be similar to the material of the layer 102, on the layer 112 (FIG. 5). When it is possible to carry out a hetero-epitaxy of the materials of layers 102 and 112, the epitaxy of the layer 114, then based on a material similar to the material of the layer 102, on the layer 112 makes it possible to reproduce the crystalline structure of the material of the layer 102 in the material of the layer 114. In this case, the thickness of the layer 112 is preferably less than the critical relaxation thickness above which the material of the layer 114 comprises a very high density of dislocations, in other words crystalline defects, no longer enabling the material of the layer 114 to have the same crystalline quality as the material of the layer 102. For example, for a pair of materials $Si/Ge_xSi_{1-x}$ used for the layers 102 and 112, the order of magnitude of the thickness not to be exceeded as a function of the content x of germanium is for example shown in FIG. 1 of the publication "Calculation of critical layer thickness versus lattice mismatch for $Si/Ge_xSi_{1-x}$ strained-layer heterostructures", of R. People and J C. Bean, APL 47, p. 322 or even from FIG. 13 of "Strain relaxation kinetics in $Si/Ge_xSi_{1-x}$ heterostructures", D C Houghton, JAP 70(4), p. 2136.

Given that the materials of the layers 114 and 102 are here similar, the layer 114 forms a portion of the layer 102, filling the remainder of the hole 110 not occupied by the layer 112 by the amorphous or monocrystalline material of the layer 102.

Figure 6:
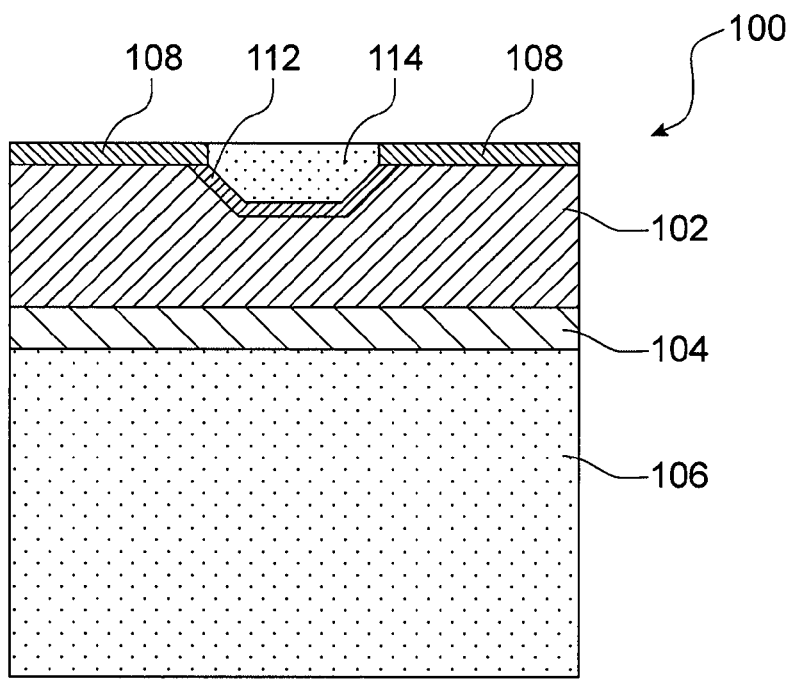
Figure 7:
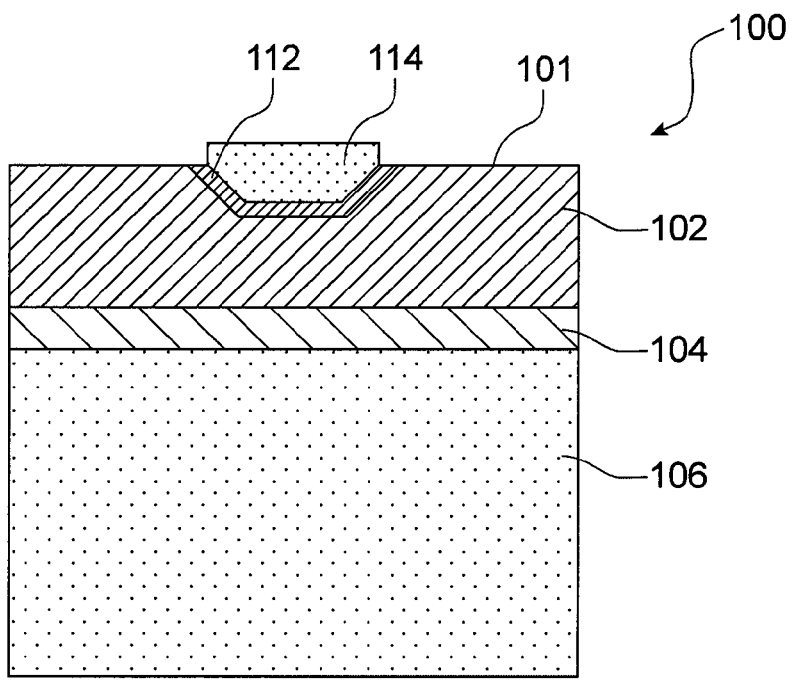

As represented in FIG. 6, a step of planarisation of the upper face of the device 100 is then carried out, for example by a chemical mechanical polishing (CMP). The mask 108 may serve as stop layer for this polishing.

The etch mask 108 of the device 100 (FIG. 7) is then eliminated, in order to be able to access the layer 112.

Figure 8:
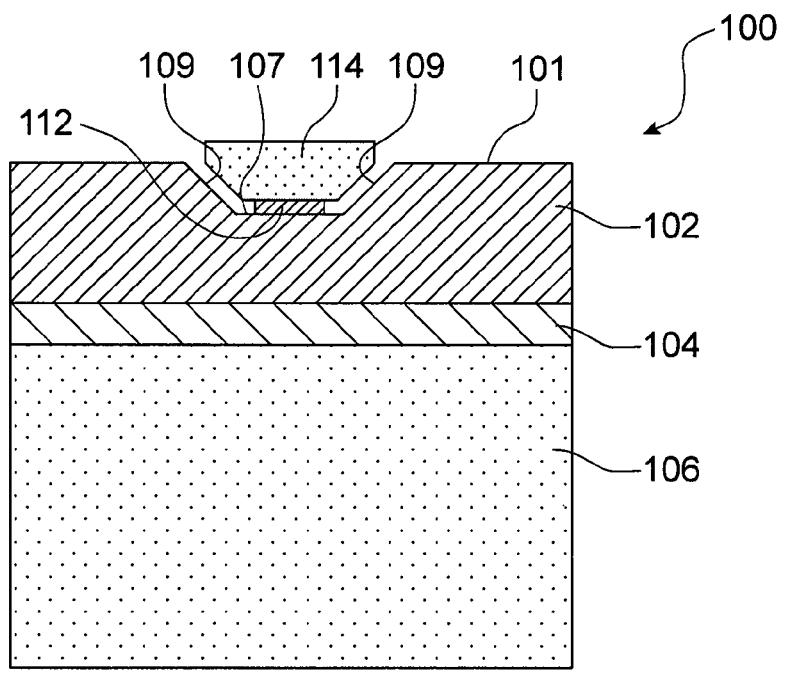

As represented in FIG. 8, a selective etching of the material of the layer 112 in relation to the layers 102 and 114 is then carried out. This etching may be carried out by a chemical attack or a plasma etching, forming shafts or trenches 116 in place of the layer 112. In FIG. 8, there are two trenches 116. In an alternative, it is possible that the space released by the layer 112 forms shafts.

In this first embodiment, the layer 112 is not etched completely, a portion of the layer 112 being conserved. In FIG. 8, the remaining portion of the layer 112 is located on the wall 107 horizontal to the bottom of the hole 110, delimiting the trenches 116. Each of the trenches 116 is inclined in relation to the plane of the upper face 101 of the layer 102, in other words that two sections of one of the trenches 116 formed, in two different planes parallel to the principal face 101 of the layer 102, are aligned in relation to one another along an axis forming a non-zero angle with a normal to the plane of the principal face 101 of the layer 102. For example, in the case of FIG. 8, these two sections have a rectangular shape, and the alignment axis is the axis extending through the centres of the two rectangular sections. This angle is a crystallographic datum: it is fixed and represents the angle between the crystallographic direction revealed and the orientation of the face of the substrate (100), and is, in the case where the crystallographic planes revealed chemically are the planes (111), equal to around 54.7°. When the two sections are of circular shape, then the alignment axis is the axis extending through the centres of the two circular sections. The walls 109 of the hole 110 form the walls of the trenches 116.

Figure 9:
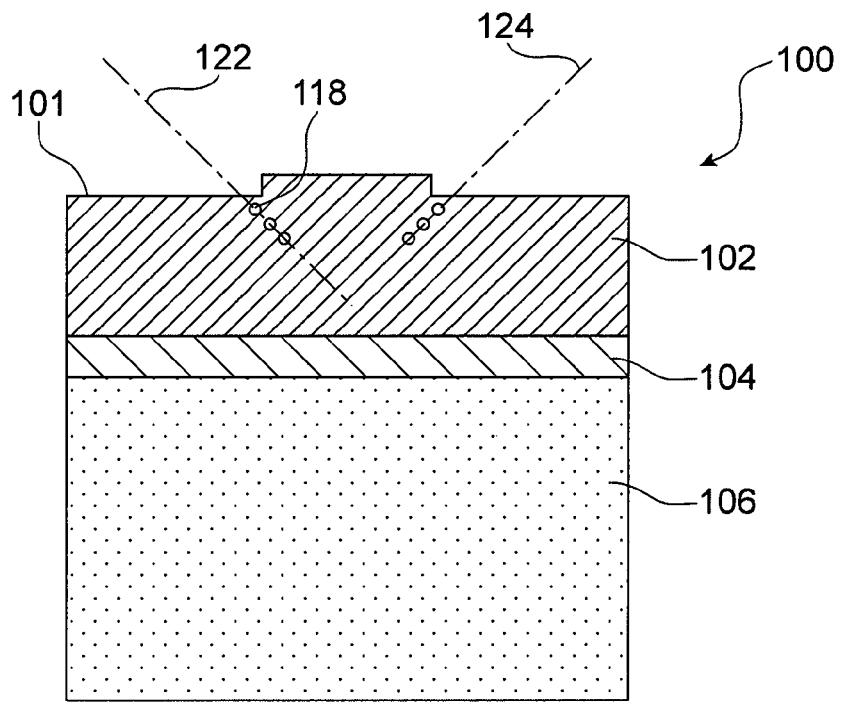

In FIG. 9, an annealing under hydrogen is then carried out, at a pressure between around 266 Pa and 100000 Pa and at a temperature between around 750° C. and 1150° C., for a time of several minutes, for example between around 1 and 10 minutes for the device 100, forming microcavities 118 in the layer 102 in place of the trenches 116. The duration of this annealing may also be longer (several tens of minutes) depending on the size of the microcavities 118 and thus the quantity of material to be displaced in the layer 102 to obtain them. These microcavities 118 are not arranged one above the other in the layer 102, in other words that the microcavities 118 formed from one of the trenches 116 are aligned in relation to each other along an axis, respectively 122 and 124 in FIG. 9, forming a non-zero angle with a normal to the plane of the face 101 of the layer 102. This axis is similar to the alignment axis of two sections of trenches and/or shafts formed during the step of eliminating the layer 112 described previously.

The ratio of the length of the inclined walls 109 over the thickness of the layer 112, which is here the relevant aspect ratio of the trench and/or the shaft formed by the elimination of the layer 112, is here above 65 to obtain at least two microcavities 118 not vertically aligned in relation to one another.

In this embodiment, the material of the layer 102 being silicon and the material of the layer 112 being an alloy based on silicon and germanium, the germanium initially present diffuses into the silicon of the layer 102 and the material of the layer 102 surrounding the microcavities 118 after annealing is an alloy based on silicon and germanium, the germanium concentration of which is lower than that of the original material of the layer 112. The microcavities are then formed in a uniform material no longer having the coexistence of two materials and thus an interface between these two materials, this interface being capable of preventing or slowing down the formation of microcavities.

Figure 10:
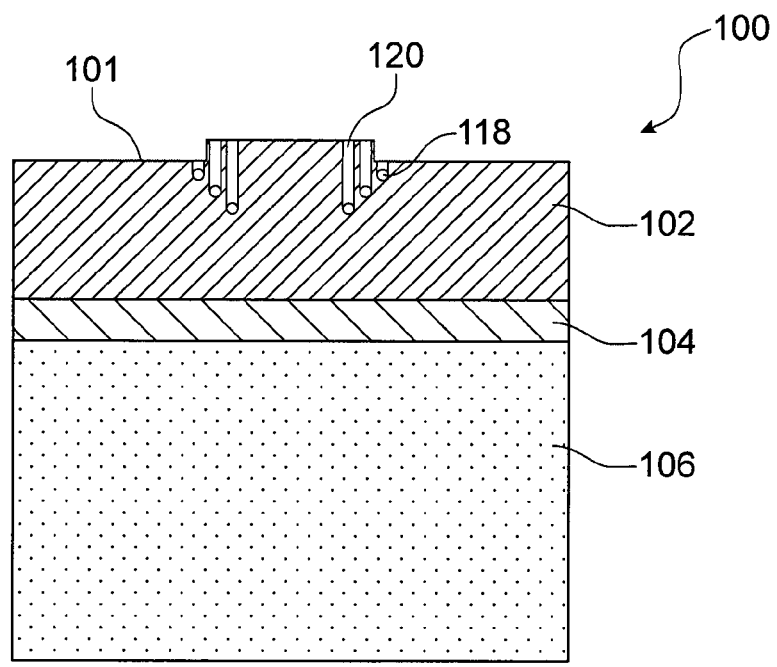

A photolithoetching step may then be implemented to access the microcavities 118, forming openings 120 in the layer 102, and connecting the upper face 101 of the layer 102 to the microcavities 118 (FIG. 10). The dimensions of the sections of the openings 120, for example of shaft shape, may be similar or not to the dimensions of the sections of the microcavities 118. In FIG. 10, the dimensions of the sections of the openings 120 are similar to the dimensions of the sections of the microcavities 118.

In an alternative of this embodiment, it is possible to eliminate the etch mask 108, for example by an anisotropic etching, before implementing the steps of forming the layers 112 and 114. The risk of a shading effect created by the overhang of the etch mask 108 above the inclined walls 109 while the layer 112 is being formed is thus limited, this shading being able to give rise to the formation of a cavity that can be blocked while the layer 114 is being formed, then preventing access to the layer 112 for the following etching step. It is also possible to eliminate the etch mask 108 after the selective etching step of the layer 112 if this layer 112 is accessible despite the presence of the mask 108.

Figure 11:
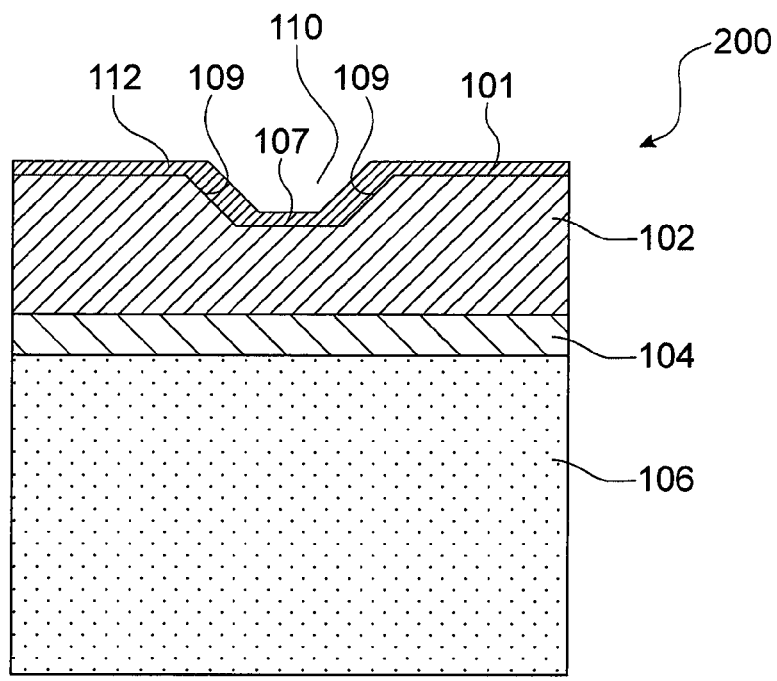
FIGS. 11 to 13 show the steps of a method for forming microcavities of different depths, object of the present invention, according to a second embodiment.
Figure 12:
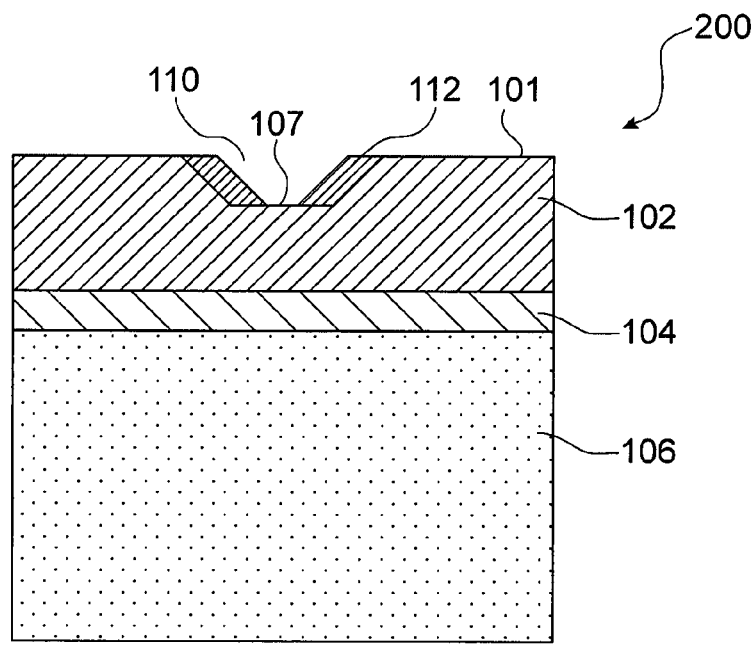
Figure 13:
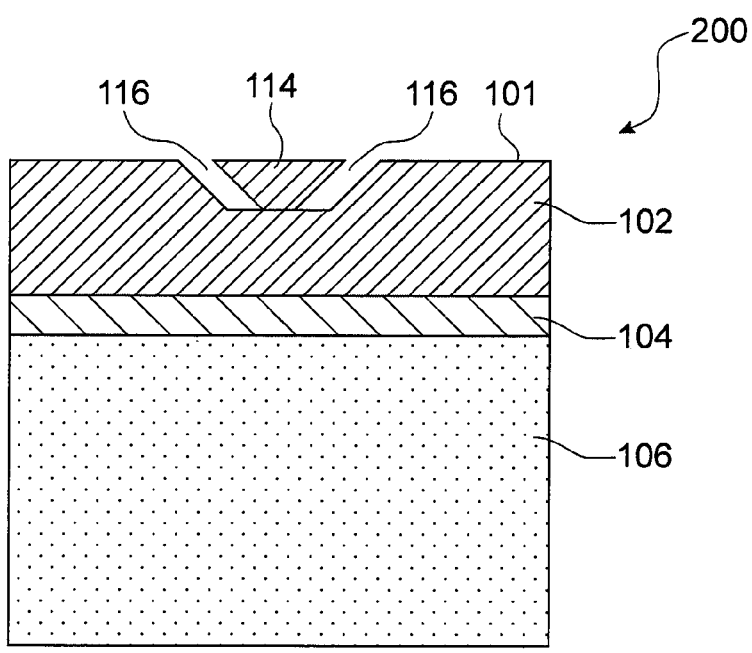

A method for forming non-aligned microcavities of different depths, according to a second embodiment, will now be described in reference to FIGS. 11 to 13.

Firstly a hole 110 is formed, for example similar to the hole 110 represented in FIG. 3A, in a device 200 comprising for example layers 102 and 104 and a substrate 106 similar to the elements with identical references described in the first embodiment.

The hole 110 has a trapezoidal shape. One of the advantages of a hole 110 of trapezoidal shape is that it is possible to grow by epitaxy the material of the layer 112 at different rates depending on whether this material is located at the bottom wall 107 or at the side walls 109. It is possible for example to have a growth rate on the side walls 109 that is higher than that on the bottom wall 107, the layer 112 obtained being represented in FIG. 11. For a certain growth time, a thicker layer 112 is thus obtained at the side walls 109 than on the remainder of the layer 102. A step of isotropic etching of the layer 112 may then be implemented to remove the material of the layer 112 located on the horizontal surfaces, in other words on the principal face 101 of the layer 102 and on the bottom wall 107 of the hole 110, while preserving the material of the layer 112 located on the side walls 109 of the hole 110 (FIG. 12).

A third layer 114 is formed by a step of growth by epitaxy of the material of the layer 102 in the hole 110, this third layer forming a portion 114 of the layer 102, then a step of chemical mechanical polishing making it possible to clear an access to the material of the layer 112. This layer 112 is then selectively eliminated to form shafts or trenches 116 (FIG. 13). In FIG. 13, each of the trenches 116 is inclined in relation to the plane of the upper face 101 of the layer 102, in other words that two sections of one of the trenches 116 formed, along two different planes parallel to the principal face 101 of the layer 102, are aligned in relation to one another along an axis forming a non-zero angle with a normal to the plane of the principal face 101 of the layer 102.

In a similar manner to the first embodiment, an annealing under hydrogenated atmosphere is then carried out to form microcavities at different depth levels in the layer 102 and which are not aligned vertically in relation to each other.

In relation to the first embodiment, this second embodiment makes it possible to carry out the annealing of the device 200 without the presence of a portion of the layer 112, and thus to conserve the initial nature of the material of the layer 102.

Figure 14:
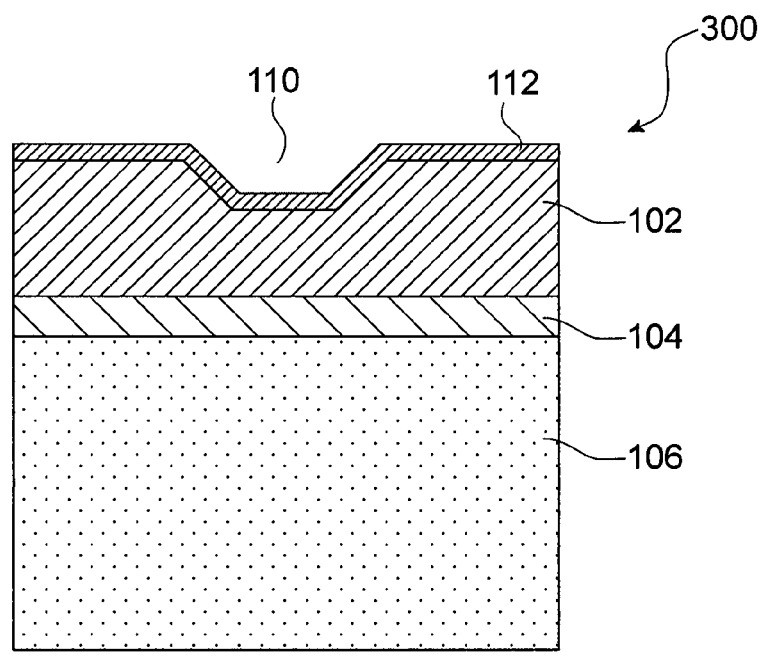
FIGS. 14 to 16 show the steps of a method for forming microcavities of different depths, object of the present invention, according to a third embodiment.
Figure 15:
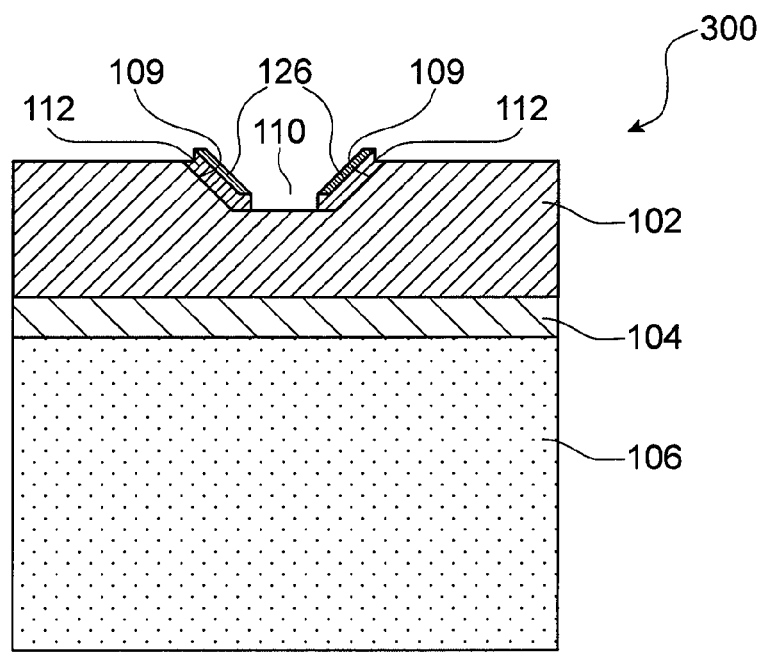
Figure 16:
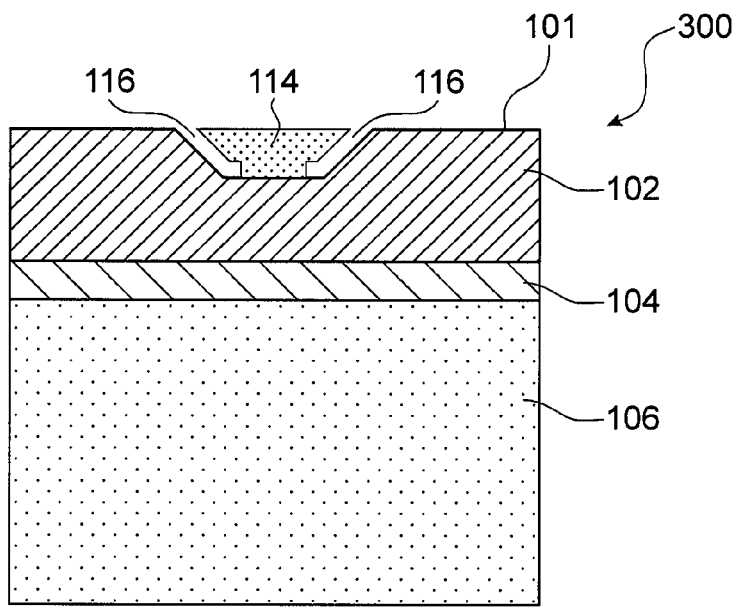

A method for forming non-aligned microcavities of different depths, according to a third embodiment, will now be described in reference to FIGS. 14 to 16.

A hole 110 is firstly formed, for example similar to the hole 110 represented in FIG. 3A, in a device 300 comprising for example layers 102 and 104 and a substrate 106 similar to the elements with identical references described in the first embodiment.

The hole 110 has a trapezoidal shape. The deposition of the layer 112 is carried out, which has a substantially uniform thickness over the entire layer 102, or a growth of the layer 102 from a material having a substantially uniform growth rate whatever the walls on which the growth is carried out (FIG. 14). Depending on the epitaxy pressure and temperature conditions, such a growth may be obtained for an alloy of silicon and germanium growing on silicon as disclosed in the document "Growth kinetics of Si and SiGe on Si(100), Si(110) and Si(111) surfaces" of J. M. Hartmann et al., Journal of Crystal Growth, 2006, n° 294, pages 288 to 295.

An etch mask 126 is then formed, for example from a deposition of one or several materials, such as a double layer of silicon dioxide and silicon nitride, and an etching of these material(s), the layer of silicon dioxide then serving as stop layer to the etching of the silicon nitride layer. This etch mask 126 covers the parts of the layer 112 located at the side walls 109 of the hole 110. A step of isotropic etching of the layer 112 may then be implemented to remove the material of the layer 112 that is not covered by the etch mask 126, in other words located on the horizontal surfaces (principal face 101 of the layer 102 and bottom wall 107 of the hole 110), while preserving the material of the layer 112 located on the side walls 109 of the hole 110 (FIG. 15).

The etch mask 126 is then eliminated, then a growth by epitaxy of the material of the layer 102 in the hole 110 is carried out to obtain a third layer 114, forming a portion 114 of the layer 102. A step of chemical mechanical polishing makes it possible to clear an access to the material of the layer 112 when this layer 112 is not accessible directly. This layer 112 is then selectively eliminated to form shafts or trenches 116 (see FIG. 16), each of the trenches 116 being inclined in relation to the plane of the upper face 101 of the layer 102, in other words that two sections of one of the trenches 116 formed, along two different planes parallel to the principal face 101 of the layer 102, are aligned in relation to one another along an axis forming a non-zero angle with a normal to the plane of the principal face 101 of the layer 102.

In a similar manner to the first and to the second embodiments, an annealing under hydrogenated atmosphere is then carried out to form microcavities at different depth levels in the layer 102 and which are not aligned vertically in relation to each other.

This third embodiment offers the same advantages as the second embodiment, without making use of a material with several growth rates as a function of the slope of the walls on which the material is developed by the formation of the layer 112.

Figure 17:
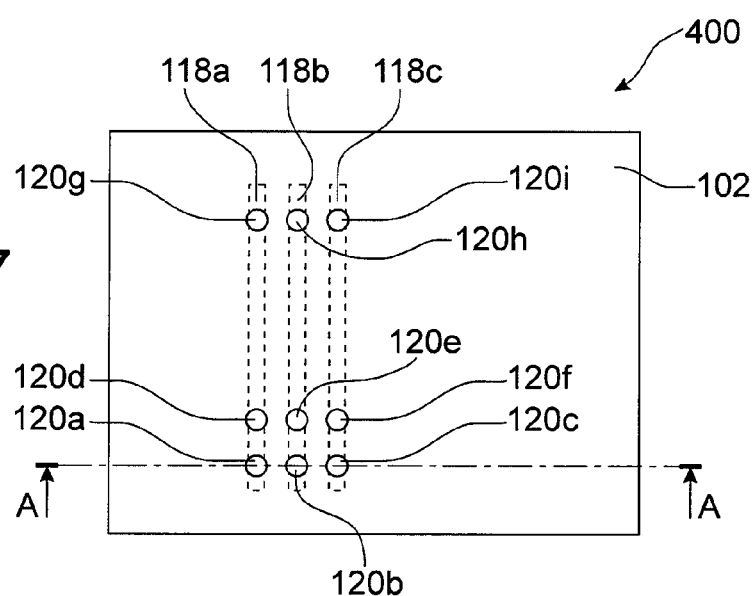
FIGS. 17 and 18 show respectively a top view and a sectional view of a device, also object of the present invention, comprising microcavities formed according to a method of forming object of the present invention.
Figure 18:
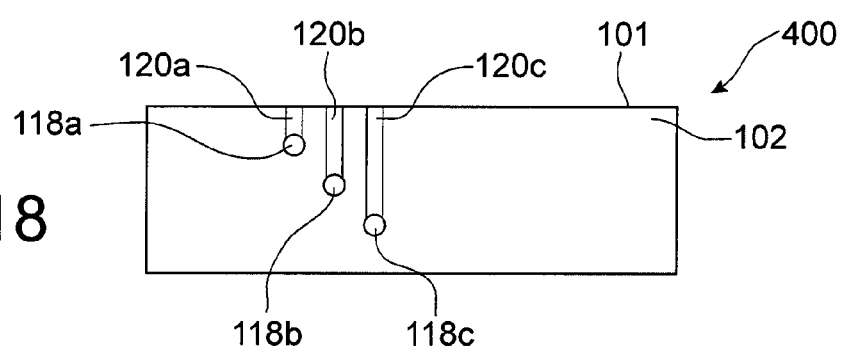

The formation method described previously makes it possible to obtain devices comprising microcavities arranged at different depths and non-aligned vertically in relation to each other. An example of such a device 400 is represented in FIGS. 17 and 18. FIG. 17 represents a top view of the device 400, FIG. 18 representing a sectional view along the axis AA, represented in FIG. 17, of the device 400. The device 400 is here a chemical analysis device that can analyse up to three samples simultaneously.

The device 400 comprises three microcavities 118a, 118b and 118c, each forming a micro-channel arranged in the layer 102 at a different depth to each other. Openings 120a, 120b and 120c, making it possible to access the microcavities 118, are formed in the layer 102. In this example of embodiment, the openings 120a to 120c enable the injection of samples into the microcavities 118, each microcavity 118 being able to contain a different sample. Openings 120d, 120e and 120f that also make it possible to access the microcavities 118, are formed in the layer 102, enabling a reactant to be injected into each microcavity 118 in order to react the samples with these reactants. Finally, openings 120g, 120h and 120i that once again make it possible to access the microcavities 118, are formed in the layer 102 and serve to collect the treated samples after they have passed through the microcavities 118.

Generally speaking, the method for forming non-aligned microcavities of different depths may be implemented for all of the application fields of the devices with microcavities described previously.

The invention claimed is:

1. A method for forming microcavities of different depths in a layer based on at least an amorphous or monocrystalline material, comprising at least the following steps in which:
   forming at least one shaft and/or trench, in the layer, to extend through one face thereof, such that two sections of the shaft and/or the trench, in two different planes parallel to said face of the layer, are aligned in relation to one another along an alignment axis forming a non-zero angle with a normal to the plane of said face of the layer, wherein the forming comprises:
   forming a hole, in the layer, comprising at least side walls inclined along a non-zero angle in relation to the normal to the plane of said face of the layer,
   deposition or epitaxy of a second layer, based on at least one second material that can be selectively etched in relation to the amorphous or monocrystalline material, on at least one side wall of the hole,
   deposition or epitaxy of a third layer, based on at least one third material, the second material being able to be etched selectively in relation to this third material, at least on the second layer,
   eliminating at least a part of the second layer, the released space forming the shaft and/or the trench; and
   annealing of the layer under hydrogenated atmosphere so as to transform the shaft and/or the trench into at least two microcavities.

2. The method according to claim 1, the hole further comprising a wall parallel to said face of the layer forming a bottom wall of the hole.

3. The method according to claim 1, a section of the hole in a plane perpendicular to said face of the layer having a trapezoidal shape.

4. The method according to claim 1, a section of the hole in a plane perpendicular to said face of the layer having a triangular shape.

5. The method according to claim 1, the second layer being completely eliminated during the eliminating at least a part of the second layer step.

6. The method according to claim 1, the hole being formed by an anisotropic etching of the layer on which is arranged an etch mask, the pattern of which forms the section of the hole at said face of the layer.

7. The method according to claim 1, the second layer being eliminated by a step of chemical etching or plasma etching.

8. The method according to claim 1, the third material being an amorphous or monocrystalline material.

* * * * *